(12) United States Patent
Chae et al.

(10) Patent No.: US 7,363,107 B2
(45) Date of Patent: Apr. 22, 2008

(54) SUBSTRATE TRANSFER SYSTEM

(75) Inventors: Kyung-Su Chae, Daegu (KR); Hyun-Ho Song, Gumi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/529,349

(22) Filed: Sep. 29, 2006

(65) Prior Publication Data
US 2007/0027575 A1 Feb. 1, 2007

Related U.S. Application Data

(62) Division of application No. 10/727,553, filed on Dec. 5, 2003, now Pat. No. 7,139,640.

(30) Foreign Application Priority Data
Dec. 31, 2002 (KR) ................................ 2002-88464

(51) Int. Cl.
G06F 7/00 (2006.01)
G06F 19/00 (2006.01)

(52) U.S. Cl. ............... 700/226; 700/113; 700/115; 700/121; 700/215; 700/218; 700/225; 700/228; 700/229; 414/937; 414/940; 414/222.01

(58) Field of Classification Search ................. 700/112, 700/113, 115, 225, 226; 414/937, 940, 222.01
See application file for complete search history.

(56) References Cited

U.S. PATENT DOCUMENTS 5,163,802 A * 11/1992 Poinelli ................. 414/555
5,510,984 A * 4/1996 Markin et al. .............. 701/87
5,570,990 A * 11/1996 Bonora et al. ............ 414/543
5,976,199 A * 11/1999 Wu et al. ................ 29/25.01
5,979,756 A * 11/1999 Ahn et al. ................. 235/383
5,980,183 A * 11/1999 Fosnight ............... 414/222.01
6,019,563 A * 2/2000 Murata et al. .......... 414/222.01
6,129,496 A * 10/2000 Iwasaki et al. ......... 414/222.01
6,721,626 B2 * 4/2004 Tomita et al. .............. 700/218
6,799,099 B2 * 9/2004 Zeitler et al. ................ 701/23
6,811,369 B2 * 11/2004 Yamada ................... 414/217.1
6,860,533 B2 * 3/2005 Lee et al. ................ 294/64.1

FOREIGN PATENT DOCUMENTS

JP     2002-050667    2/2002
KR     1999-0080846   11/1999

OTHER PUBLICATIONS

Korean Office Action dated May 9, 2005.

* cited by examiner

Primary Examiner—Michael D. Masinick
(74) Attorney, Agent, or Firm—McKenna Long & Aldridge LLP

(57) ABSTRACT

A substrate transfer system is used in fabricating a liquid crystal display (LCD) device. The system includes a cassette having a bar code, a cassette stocker to store the cassette; an auto guided vehicle that is able to transfer the cassette; a moving path unit to determine a moving path of the auto guided vehicle, a plurality of process stages at which processes are conducted on a substrate during fabrication of the LCD device, and a host to control the cassette stocker, the auto guided vehicle and the process stages. At least one of the auto guided vehicle and the cassette stocker having a bar code reader.

1 Claim, 4 Drawing Sheets

SUBSTRATE TRANSFER SYSTEM

This Application is a Divisional of U.S. patent application Ser. No. 10/727,553, filed Dec. 5, 2003, now U.S. Pat. No. 7,139,640, which is hereby incorporated by reference.

The present invention claims the benefit of Korean Patent Application No. 2002-88464 filed in Korea on Dec. 31, 2002, which is hereby incorporated by reference.

BACKGROUND OF THE INVENTION

1. Field of the Invention

The present invention relates to a substrate transfer system for a liquid crystal display (LCD) device, and more particularly, to a system having an auto guided vehicle provided with a bar code reader and for transferring a cassette in which a substrate is loaded.

2. Description of the Related Art

Generally, an LCD device comprises a TFT array substrate and a color filter substrate bonded together by a sealant with liquid crystal filled therebetween. A liquid crystal display panel is usually formed of a glass substrate. Nowadays, a liquid crystal display panel of large size can be produced. However, it is difficult to transfer the liquid crystal display panel of large size, and therefore, there has arisen a need for a substrate transfer system to transfer a large sized substrate.

In the related art, a substrate is transferred by a cassette in which one or more substrates are loaded. The cassette is transferred to a stage of a corresponding step by an auto guided vehicle. The transfer system comprises a cassette stocker where a substrate cassette is stored; a robot arm for taking out the substrate cassette from the cassette stocker; an auto guided vehicle for transferring the substrate cassette; a rail on which the auto guided vehicle moves; a plurality of stages; and a main computer such as a host for controlling the auto guided system.

The substrate cassette transfer system in accordance with the related art will be explained with reference to FIG. 1.

First of all, substrates go through various processes, and substrates that have undergone the same processes are loaded in the same cassette and stored in the cassette stocker. That is, for example, substrates which have undergone a process for forming a gate line among processes for fabricating a thin film transistor as a switching device are loaded in the same cassette to be held or stored until next processes.

To perform predetermined processes using the substrates loaded in the cassette stoker, the substrate cassette is loaded on the auto guided vehicle from the cassette stoker. The process is performed by giving an order to the cassette stocker by the host. Therefore, the cassette stocker is provided with a receiver for receiving data from the host. The substrate cassette loaded on the auto guided vehicle is transferred to a process stage where a corresponding process will be performed. The auto guided vehicle moves along a predetermined path and, thus, arrives at a corresponding stage. The corresponding stage may be a fabricating apparatus for an LCD device including a chamber where various processes, for example, the cassette cleaning, sputtering, photo resist formation, etc. are performed.

Each stage includes a shelf for holding the transferred substrate cassette until use. The auto guided vehicle arrives at the corresponding stage and unloads the cassette where the substrate is loaded on the shelf of the corresponding stage using the robot arm of the auto guided vehicle. Also, a bar code reader formed at an arbitrary point of the shelf which is at one side of the stage reads a bar code attached to one side of the cassette to recognize the cassette, and then transmits data to the host. Accordingly, the host determines processes of a corresponding cassette.

If the bar code reader transmits the read information to the host, the host determines which process will be performed for the corresponding cassette and orders the process to progress or stop at the corresponding stage. The substrate which has undergone a specific process on the corresponding stage is reloaded into the substrate cassette. Then, the host calls an empty auto guided vehicle to load the cassette where the processed substrate is loaded and to transfer to the cassette stocker for storage.

However, in the substrate transfer system, the bar code reader has to be respectively provided on each stage, thereby increasing cost. That is, the bar code reader is an expensive device causing increased cost.

SUMMARY OF THE INVENTION

Accordingly, the present invention is directed to a substrate transfer system that substantially obviates one or more of the problems due to limitations and disadvantages of the related art.

An object of the present invention is to provide a substrate transfer system having a bar code reader that reads a bar code of a substrate cassette at an auto guided vehicle or a cassette stocker with reduced cost and stable operation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate transfer system for use in fabricating a liquid crystal display (LCD) device comprises a cassette having a bar code; a cassette stocker to store the cassette; an auto guided vehicle having a bar code reader, the auto guided vehicle being able to transfer the cassette; a moving path unit to determine a moving path of the auto guided vehicle; a plurality of process stages at which processes are conducted on a substrate during fabrication of the LCD device; and a host to control the cassette stocker, the auto guided vehicle, and the process stages.

In another aspect, a substrate transfer system for use in fabricating a liquid crystal display (LCD) device comprises a cassette having a bar code; a cassette stocker to store the cassette, the cassette stocker having a bar code reader; an auto guided vehicle being able to transfer the cassette; a rail disposed along a moving path of the auto guided vehicle; a plurality of process stages at which processes are conducted on a substrate during fabrication of the LCD device; and a host to control the cassette stocker, the auto guided vehicle, and the process stages.

In another aspect, a method for transferring a substrate during fabrication of a liquid crystal display (LCD) device comprises the steps of unloading a cassette having a bar code from a cassette stocker to an auto guided vehicle having a bar code reader; reading the bar code attached to the cassette using the bar code reader; analyzing information from the bar code reader; directing the auto guided vehicle to a stage where a process is to be performed; loading the cassette on the stage; detecting a cassette on which the process has been completed and transmitting the information to a host; directing the auto guided vehicle to the stage where the processed cassette is disposed and loading the processed cassette into the auto guided vehicle; and transferring the cassette to the cassette stocker.

In another aspect, a substrate transfer system of a liquid crystal display (LCD) device comprises the steps of reading a bar code attached to a cassette using a bar code reader disposed in a cassette stocker; loading a cassette from the cassette stocker having the bar code reader to an auto guided vehicle; directing the auto guided vehicle to a stage where a process is to be performed; unloading the cassette on the stage; detecting a cassette on which the process has been completed and transmitting the information to a host; directing the auto guided vehicle to the stage where the processed cassette is disposed and loading the cassette into the auto guided vehicle; and transferring the cassette to the cassette stocker.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
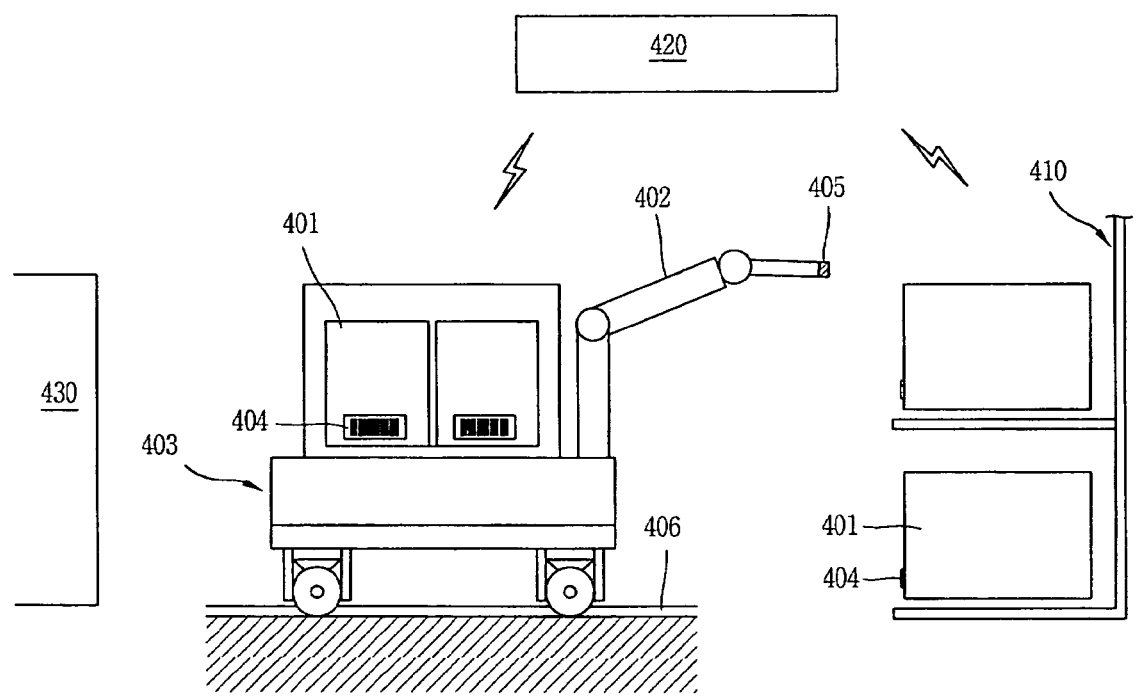
FIG. 4 is a conceptual view showing a substrate transfer system in accordance with the present invention.

With reference to FIG. 4, the present invention contemplates a plurality of cassettes 401 where a plurality of substrates classified according to each process are loaded and stored in a cassette stocker 410. Also, a robot arm 402 for loading/unloading the substrate cassette 401 into/from the cassette stocker 410, and a receiver for receiving data from a host 420 may be provided in the cassette stocker 410.

The auto guided vehicle 403 comprises a cassette loading unit formed at an upper portion of the auto guided vehicle 403 and on which a cassette 401 is placed, a caster arranged at a lower portion of the auto guided vehicle 403 for moving the auto guided vehicle, a caster driving unit for driving the caster, data transmitting/receiving unit for transmitting/receiving data to/from a host 420 by wire/wireless communication, a bar code reader 405 for reading a bar code 404 attached to a cassette 401, and a robot arm 402 for loading/unloading a cassette 401 on/from a shelf of a corresponding stage 430. A position detecting sensor 450 for detecting a position of the auto guided vehicle 403 and transmitting the information to the host 420 is mounted, for example, at a predetermined location of a rail which determines a moving path 406 of the auto guided vehicle 403. The position detecting sensor 450 is generally installed in front of respective stages to stop the auto guided vehicle 403 in front of them. A shelf for loading/unloading the substrate cassette 401 from the auto guided vehicle 403, and a substrate cassette detecting sensor for detecting the processed substrate cassette 401 are installed on the stage 430.

The bar code reader 405 for reading a bar code 404 attached to a predetermined position of the cassette 401 is installed in the auto guided vehicle 403 which transfer the cassette 401. The bar code reader 405 can be installed at the robot arm 402 arranged at one side of the auto guided vehicle 403. Here, the bar code reader 405 need not be installed on the shelf of each stage 430.

Figure 1:
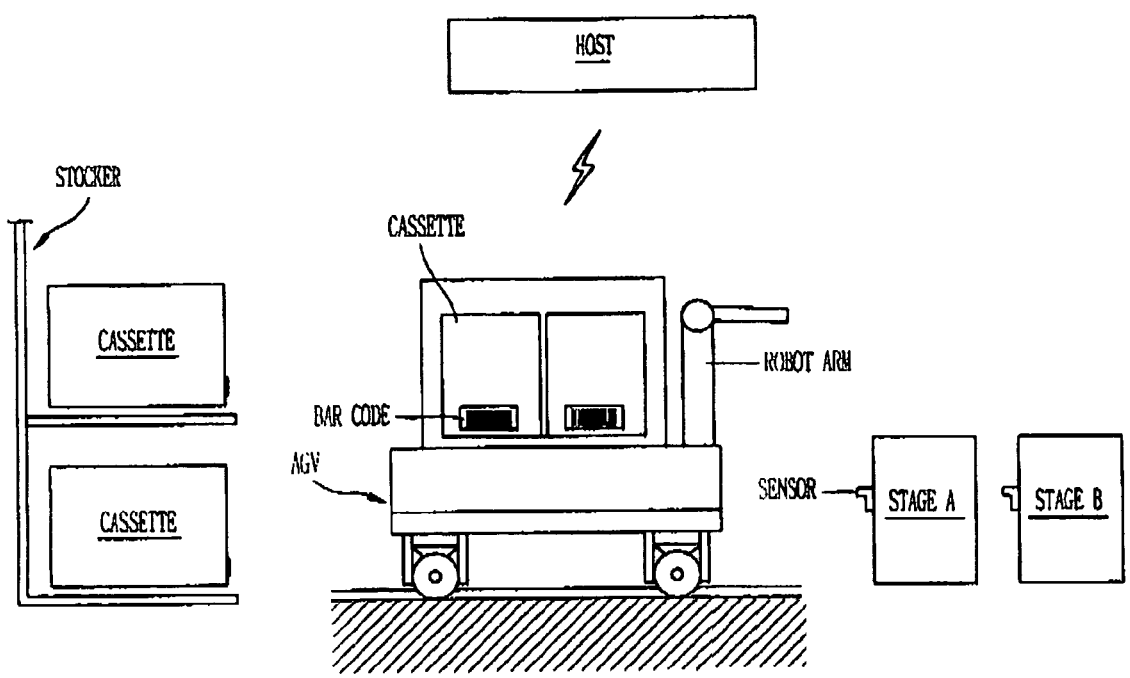
FIG. 1 is a conceptual view showing a substrate transfer system in accordance with the related art.
Figure 2:
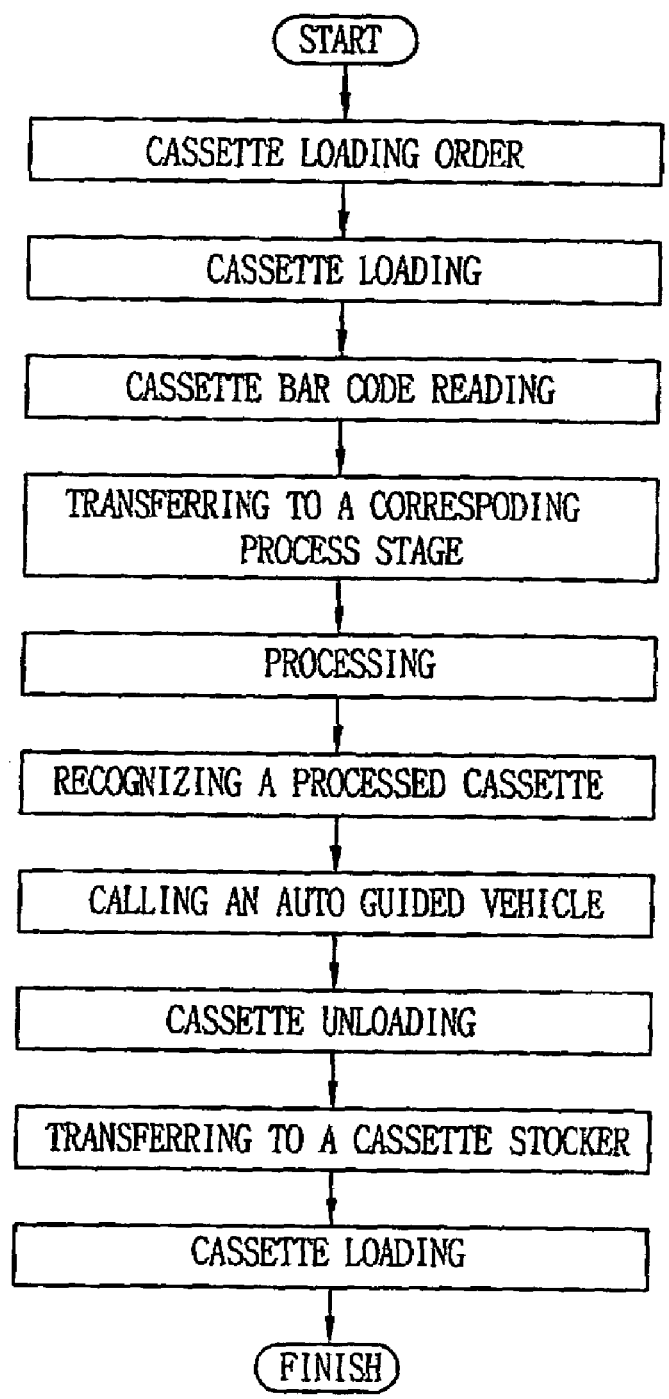
FIG. 2 is a block diagram showing operation of a substrate transfer system according to the present invention.

Operation of the system according to the present invention will be explained with reference to FIG. 2.

First, the cassette containing substrates that have undergone the same processes is loaded into the auto guided vehicle from the cassette stocker. Of course, it should be recognized that in some circumstances that it may be desired that the substrates have not undergone the same processes. The cassette stocker loads the cassette where substrates having processes to be performed are loaded into the auto guided vehicle by receiving an order from the host. The loading of the substrate cassette is performed by the robot arm installed at one side of the cassette stocker. The auto guided vehicle arrives at a corresponding stage through a moving path, such as a rail that guides the auto guided vehicle.

The position detecting sensor for detecting a position of the auto guided vehicle is mounted at a predetermined location of the rail which corresponds to a corresponding stage, thereby stopping the auto guided vehicle at a precise position and transmitting the position information of the auto guided vehicle to the host. The auto guided vehicle having arrived at the corresponding stage reads the bar code of the loaded substrate cassette by the bar code reader installed at the robot arm located at one side thereof and transmits the information to the host. The host analyzes the information, determines whether the substrates loaded into the auto guided vehicle should have predetermined processes performed or not, and transmits an order to the auto guided vehicle.

If it is determined that the substrate should have the predetermined processes performed on the corresponding stage, the robot arm provided at one side of the auto guided vehicle loads the cassette on the shelf of the corresponding stage. The host analyzes the information received from the bar code, a unique identification mark of the substrate, thereby determining a current process progression state and processes to be performed on the substrate. The auto guided vehicle may wait in front of the corresponding stage while processes are performed on the corresponding stage, or may move to another stage to enhance efficiency of the processes.

The processed substrate on the corresponding stage is reloaded into a waiting cassette, and the cassette detecting sensor of the corresponding stage transmits information to the host that processes of the substrate in the cassette are completed. The host analyzes the transmitted data and calls an empty auto guided vehicle to the corresponding stage. The robot arm installed at the auto guided vehicle loads the processed cassette into the called auto guided vehicle. When the cassette is loaded into the auto guided vehicle, the bar code reader simultaneously reads the bar code attached to the cassette and transmits the information to the host. The host analyzes the information received from the bar code reader and stores process information of the cassette.

Then, auto guided vehicle where the processed transfers the loaded cassette to the cassette stocker thus to store. Herein, communication among the host, the cassette stocker, the auto guided vehicle, and the respective stages is performed by wireless or by wire such as LAN.

As aforementioned, since the bar code reader is installed on the robot arm of the auto guided vehicle to detect the cassette, the number of the bar code reader needed can be greatly reduced as compared to the related art having a bar code reader respectively provided on each shelf of each corresponding stage.

Figure 3:
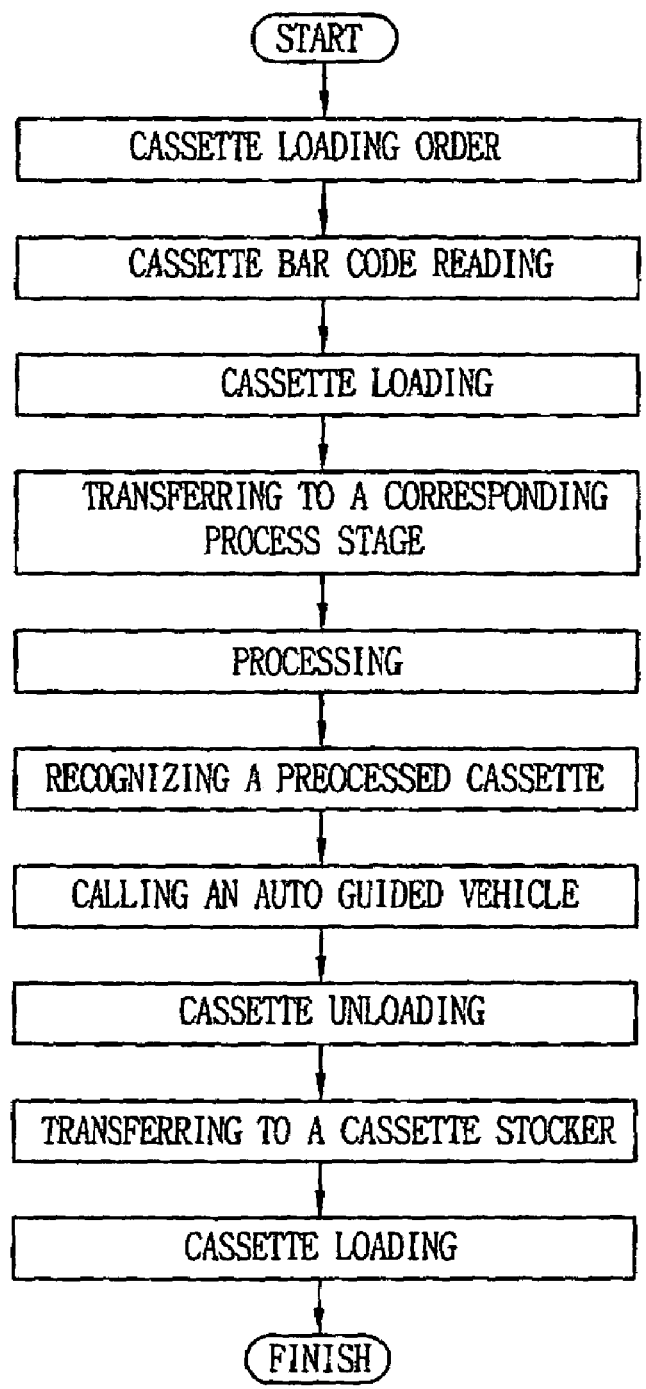
FIG. 3 is a block diagram showing operation of a substrate transfer system according to another embodiment of the present invention.

In another embodiment of the present invention, the bar code reader is installed on the cassette stocker. Specifically, the bar code reader is formed at one side of the cassette stocker and installed at the robot arm which loads the cassette into the substrate auto guided vehicle. FIG. 3 explains an exemplary operation of this embodiment of the present invention.

The cassette having the substrate therein is loaded into the auto guided vehicle by the robot arm formed at a side of the cassette stocker. A loading order is given to the cassette stocker from the host via a receiver for receiving the order from the host installed on the cassette stocker. The transmission of the order can be performed by wire or by wireless communication.

The bar code, an identification mark for identifying the cassette, is attached to a predetermined position on the loaded substrate cassette. A bar code reader, installed at a predetermined position of the cassette stocker, reads the bar code and transmits the information to the host. The bar code reader can be installed on the robot arm which loads the cassette into the auto guided vehicle.

The host analyzes the transmitted information received from the bar code reader installed at the cassette stocker and orders the auto guided vehicle to transfer the cassette onto a stage where the substrate is to progress. The substrate stage is loaded into the auto guided vehicle by the robot arm of the cassette stocker, and the auto guided vehicle moves to a corresponding stage.

A position detecting sensor for detecting a position of the auto guided vehicle is attached to one side of the rail at a corresponding stage. Using the position detecting sensor, the auto guided vehicle is precisely positioned in front of the corresponding stage. The auto guided vehicle then unloads the loaded cassette on the shelf of the corresponding stage. The cassette is unloaded by the robot arm installed at the auto guided vehicle.

While the substrate cassette is transferred to the corresponding stage, the auto guided vehicle just transfers the substrate cassette. Whether the substrate loaded in the cassette is to be delivered to next processes or not is determined by the host on the basis of the information read by the bar code reader attached to the cassette stocker.

The substrate cassette unloaded on the shelf of the corresponding stage is processed at the corresponding stage. The auto guided vehicle can wait at a designated position while processes are performed on the corresponding stage, or can move to another stage to enhance efficiency of the processes.

The processed substrates on the corresponding stages are reloaded in the cassette, and wait for the auto guided vehicle on the shelf. A sensor for detecting the processed cassette is attached on the shelf where the cassette in which the processed substrate is loaded is located, thereby detecting the processed cassette and transmitting the information to the host. The host analyzes the information, sends an empty auto guided vehicle to the stage where the processed cassette is located, and loads the cassette into the auto guided vehicle. The auto guided vehicle moves and stores the substrate cassette to the cassette stocker.

As aforementioned, in the present invention, the bar code reader attached to the substrate cassette is installed on the auto guided vehicle or the cassette stocker instead of installing on each shelf of each corresponding stage of the related art. According to this, the number of the bar code readers can be greatly reduced, thereby reducing cost while efficiently achieving, thereby the cassette transfer. Also, the bar code reader is not needed on the stage enhancing an area efficiency.

It will be apparent to those skilled in the art that various modifications and variations can be made in the substrate transfer system of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display (LCD) device using a substrate transfer system, comprising the steps of:
   providing a cassette having a bar code;
   providing a cassette stocker to store the cassette;
   providing an auto guided vehicle having a bar code reader, the auto guided vehicle being able to transfer the cassette;
   determining a moving path of the auto guided vehicle using a moving path unit;
   providing a plurality of process stages at which processes are conducted on a substrate during fabrication of the LCD device;
   reloading the processed substrate on the corresponding stage into a waiting cassette;
   detecting the processed cassette using a cassette detecting sensor and transmitting an information to a host computer, wherein the information is that processes of the substrate in the cassette are completed;
   controlling the cassette stocker, the auto guided vehicle, and the process stages by the host computer:
   performing a plurality of processes respectively on a color filter substrate and a thin film transistor substrate, the color filter substrate and the thin film transistor substrate being transferred using the substrate transfer system; and
   attaching the color filter substrate and the thin film transistor substrate together with liquid crystal material being disposed therebetween.

* * * * *